United States Patent
Figueiredo et al.

(10) Patent No.: US 8,610,422 B2
(45) Date of Patent: Dec. 17, 2013

(54) DYNAMIC BIASING OF AN AMPLIFIER USING CAPACITIVE DRIVING OF INTERNAL BIAS VOLTAGES

(75) Inventors: Pedro M. Figueiredo, São Domingos de Rana (PT); Paulo Cardoso, Porto Salvo (PT)

(73) Assignee: Synopsys, Inc., Mountain View, CA (US)

( * ) Notice: Subject to any disclaimer, the term of this patent is extended or adjusted under 35 U.S.C. 154(b) by 71 days.

(21) Appl. No.: 13/357,396

(22) Filed: Jan. 24, 2012

(65) Prior Publication Data

US 2013/0187629 A1 Jul. 25, 2013

(51) Int. Cl.
*G05F 3/02* (2006.01)

(52) U.S. Cl.
USPC .......................................... 323/315; 330/257

(58) Field of Classification Search
USPC .................................................. 330/252–261
See application file for complete search history.

(56) References Cited

U.S. PATENT DOCUMENTS

| | | | | |
|---|---|---|---|---|
| 7,218,170 B1 * | 5/2007 | Carter et al. | .................. | 327/552 |
| 8,093,952 B2 * | 1/2012 | Behzad et al. | ................ | 330/288 |

OTHER PUBLICATIONS

Abo, A. et al., "A 1.5-V, 10-bit, 14.3-MS/s CMOS Pipeline Analog-to-Digital Converter," IEEE Journal of Solid-State Circuits, May 1999, pp. 599-606, vol. 34, No. 5.
Cao, Z. et al., "A 32 mW 1.25 GS/s 6b 2b/Step SAR ADC in 0.13 μm CMOS," IEEE Journal of Solid-State Circuits, Mar. 2009, pp. 862-873, vol. 44, No. 3.
Choi, H-C. et al., "A 15mW 0.2mm² 10b 50MS/s ADC with Wide Input Range," 2006 IEEE International Solid-State Circuits Conference, IEEE, Feb. 7, 2006, 10 pages.
Crols, J. et al., "Switched-Opamp: An Approach to Realize Full CMOS Switched-Capacitor Circuits at Very Low Power Supply Voltages," IEEE Journal of Solid-State Circuits, Aug. 1994, pp. 936-942, vol. 29, No. 8.
Galan, J.A. et al., "Super Class-AB OTAs With Adaptive Biasing and Dynamic Output Current Scaling," IEEE Transactions on Circuits and Systems—I. Regular Papers, Mar. 2007, pp. 449-457, vol. 54.
Kim, H-C. et al., "A 30mW 8b 200MS/s Pipelined CMOS ADC Using a Switched-Opamp Technique," 2005 IEEE International Solid-State Circuits Conference, Feb. 8, 2005, pp. 284-285, 598.

* cited by examiner

*Primary Examiner* — Hieu Nguyen
(74) *Attorney, Agent, or Firm* — Fenwick & West LLP

(57) ABSTRACT

A system and a method are disclosed for using driving capacitors to dynamically bias an amplifier in a stage of a pipeline analog-to-digital converter (ADC). The drain of the amplifier is connected to a sink transistor, and the driving capacitors are used to raise or lower the voltage at the gate of the sink transistor. The driving capacitors can be used in this manner to rapidly power the amplifier on and off to save power and/or to selectively boost the drain current of the amplifier to improve the response time of the pipeline ADC stage.

18 Claims, 10 Drawing Sheets

DYNAMIC BIASING OF AN AMPLIFIER USING CAPACITIVE DRIVING OF INTERNAL BIAS VOLTAGES

BACKGROUND

1. Field of Art

The disclosure generally relates to the field of analog-to-digital converters, and in particular to using switched capacitors to dynamically bias an amplifier in an ADC.

2. Description of the Related Art

Analog-to-digital converters (ADCs) are used in many different electronic devices to convert a continuous analog voltage or current into a discrete digital signal. For example, ADCs may be used in audio equipment to make digital recordings of analog audio sources such as microphones, in digital oscilloscopes to rapidly sample an analog signal, or in networking equipment such as wireless and wireline baseband analog interfaces. There are many different types of ADCs, such as flash ADCs, successive approximation ADCs, and pipeline ADCs, and each type of ADC has its own advantages and drawbacks.

A pipeline ADC is favorable when a precise digital value and a fast sample rate are desired. A pipeline ADC contains several cascaded stages, and each stage produces a portion of the digital output signal. Since the stages operate concurrently, the pipeline ADC is able to achieve a faster sample rate compared to other types of ADCs that provide the same level of precision. The drawback is that the stages in the pipeline ADC consume a significant amount of power. Thus, it is advantageous to reduce the power consumption of a pipeline ADC while maintaining its sampling rate and precision.

SUMMARY

Embodiments relate to a current mirror containing a sink transistor that receives a drain current from an electronic device. A driving capacitor is used to temporarily increase the gate voltage of the sink transistor, which causes a temporary increase in the drain current of the sink transistor. The increased drain current leads to an improvement in the response time of the electronic device.

Embodiments also relate to using a driving capacitor to rapidly raise and lower the gate voltage of the sink transistor. In this way, rapid power switching of the electronic device may be achieved.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Overview of Pipeline ADC Architecture and Operation

Figure 1:
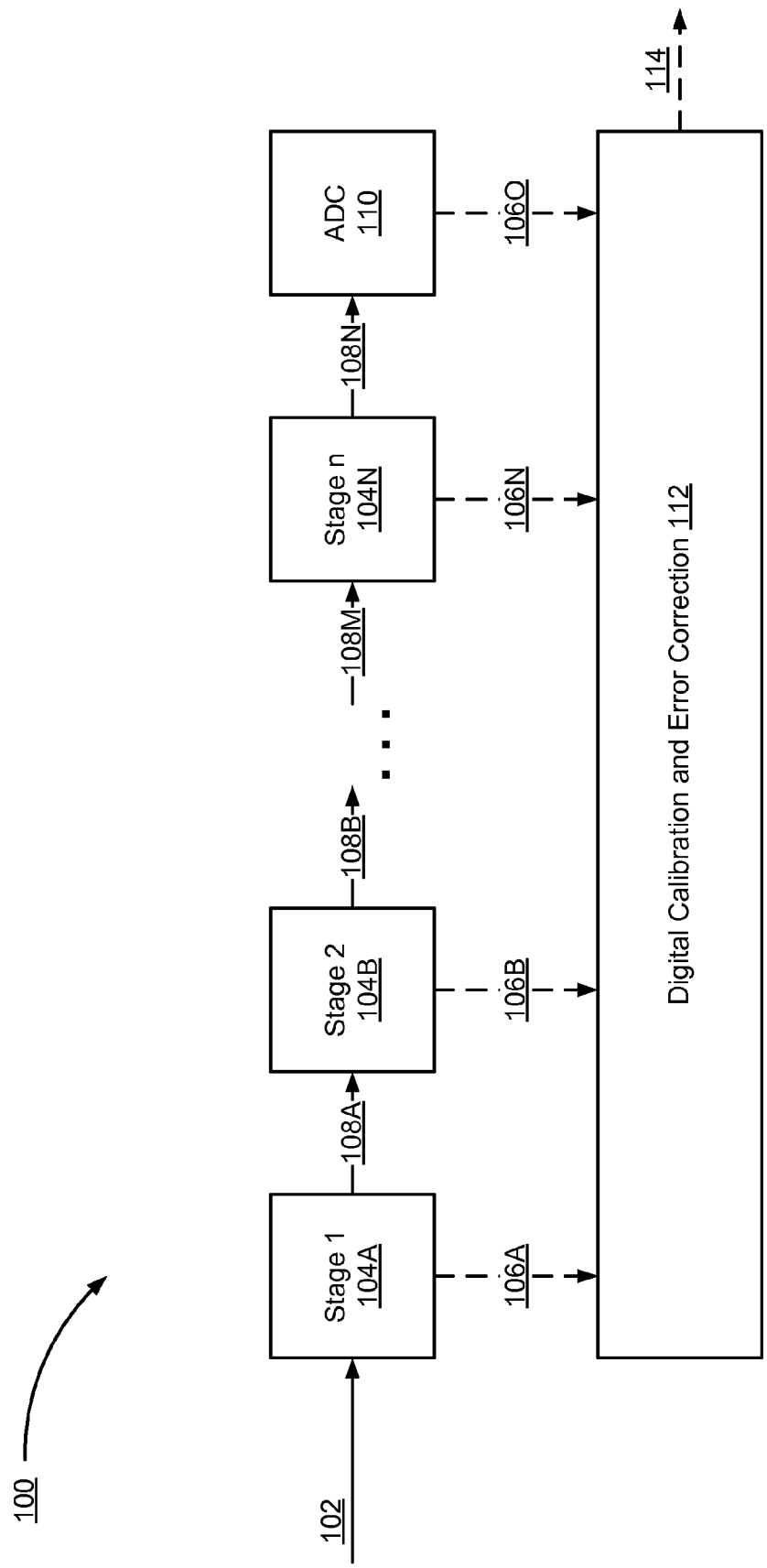
FIG. 1 is a high-level block diagram of a pipeline analog-to-digital converter (ADC).

FIG. 1 is a high-level block diagram of a pipeline analog-to-digital converter (ADC) 100. At a high level, the pipeline ADC receives an analog voltage 102 and outputs a digital representation 114 of the analog voltage 102 relative to a reference voltage. For example, a six-bit pipeline ADC with a reference voltage of 10 V would generate a digital output of binary 010011 for an analog voltage 102 of 3 V. The maximum digital output of binary 111111 represents the reference voltage of 10 V, so the digital output of binary 010011 indicates that the analog voltage 102 is approximately 29.69% of the reference voltage.

The pipeline ADC 100 contains a series of stages 104A through 104N. Each stage 104A through 104N determines a portion of the digital output 114 and passes a residue signal to the next stage. The final stage 104N passes its residue to an ADC 110 that determines the least significant bits of the output 114. The ADC 110 may be implemented as a flash ADC or some other type of ADC. For example, a six-bit pipeline ADC may contain two two-bit stages and a two-bit ADC. In this case, the first stage would determine the two most significant bits of the digital output, the second stage would determine the next two bits, and the ADC would determine the last two bits.

Each stage 104A through 104N and the ADC 110 generate an output 106A through 106O representing a portion of the digital output 114. The digital calibration and error correction 112 receives the output 106A through 106O of each stage 104A through 104N and the ADC 110 and concatenates the outputs 106A through 106O into a single digital output 114. The digital calibration and error correction 112 may also perform functions associated with calibrating the individual stages 104A through 104N to maintain their accuracy.

The stages 104A through 104N and the ADC 110 may also be configured to determine a fractional number of bits. For example, the stages 104A through 104N and the ADC 110 may each be configured to determine 1.5 bits of the digital output 114. In this case, each component 104A through 104N and 110 would output binary 00, 01, or 10, and the digital error correction 112 would use a more sophisticated method to process the results 106A through 106O to generate a final digital output 114.

Figure 2A:
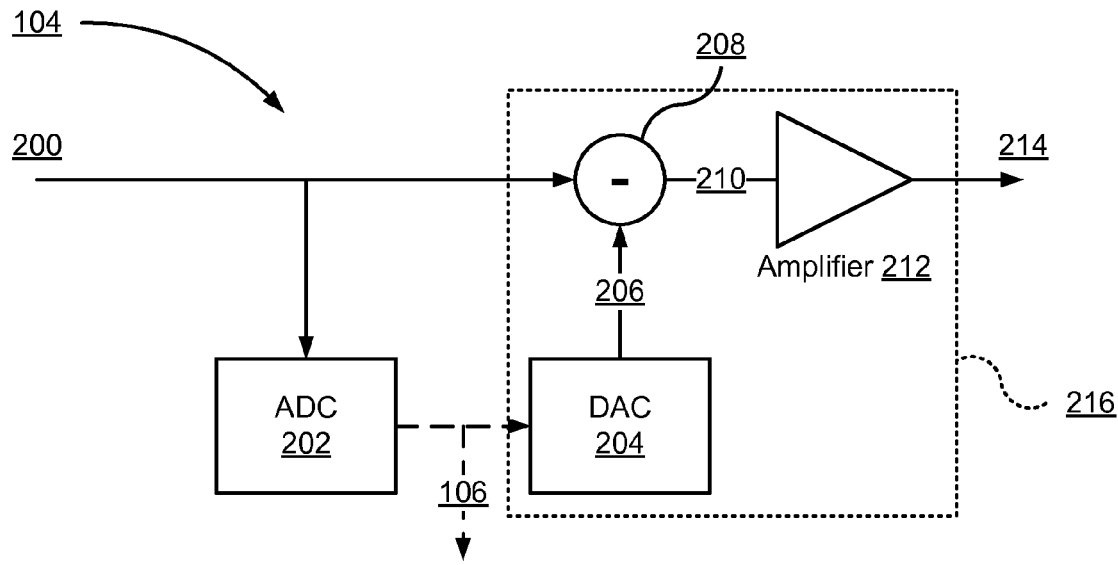
FIG. 2A is a high-level block diagram of one stage of the pipeline ADC.

FIG. 2A is a high-level block diagram of one stage 104 of a pipeline ADC 100. The stage contains an ADC 202, a DAC 204, a subtractor 208, and an amplifier 212. The ADC 202 receives the input 200 to the stage and generates the output 106 that is sent to the digital error correction 112. For example, a two-bit stage would contain a two-bit ADC 202 that quantizes the input voltage 200 by dividing the input range in four regions and indicating the region the input voltage 200 lies in. The DAC 204, which has the same resolution as the ADC 202, receives the output 106 of the stage and converts the output 106 back to an analog voltage 206.

The subtractor 208 receives the input voltage 200 and the quantized input 206 from the DAC 204 and outputs the difference 210 between the two voltages. The difference 210 is passed to the amplifier 212, which amplifies the difference to generate a residue 214 that has the same voltage range as the input 200. For example, suppose the input voltage 200 remains between ground and a reference voltage of 10 V. If the stage 104 has a resolution of two bits, then the difference 210 between the input voltage 200 and the quantized input 206 would remain between ground and 2.5 V. Thus, the amplifier 212 would have a gain of 4 to generate a residue 214 that also has a voltage range between ground and 10 V. Since the residue 214 outputted by each stage 104 has the same voltage range as the input 200, each of the stages 104A through 104N may be implemented as identical circuits.

The functions of the DAC 204, the subtractor 208, and the amplifier 212 may be implemented as a single circuit 216, known in the art as a multiplying digital-to-analog converter (MDAC) circuit. A brief description of an example MDAC circuit 216 is provided below with reference to FIG. 2B.

Figure 2B:
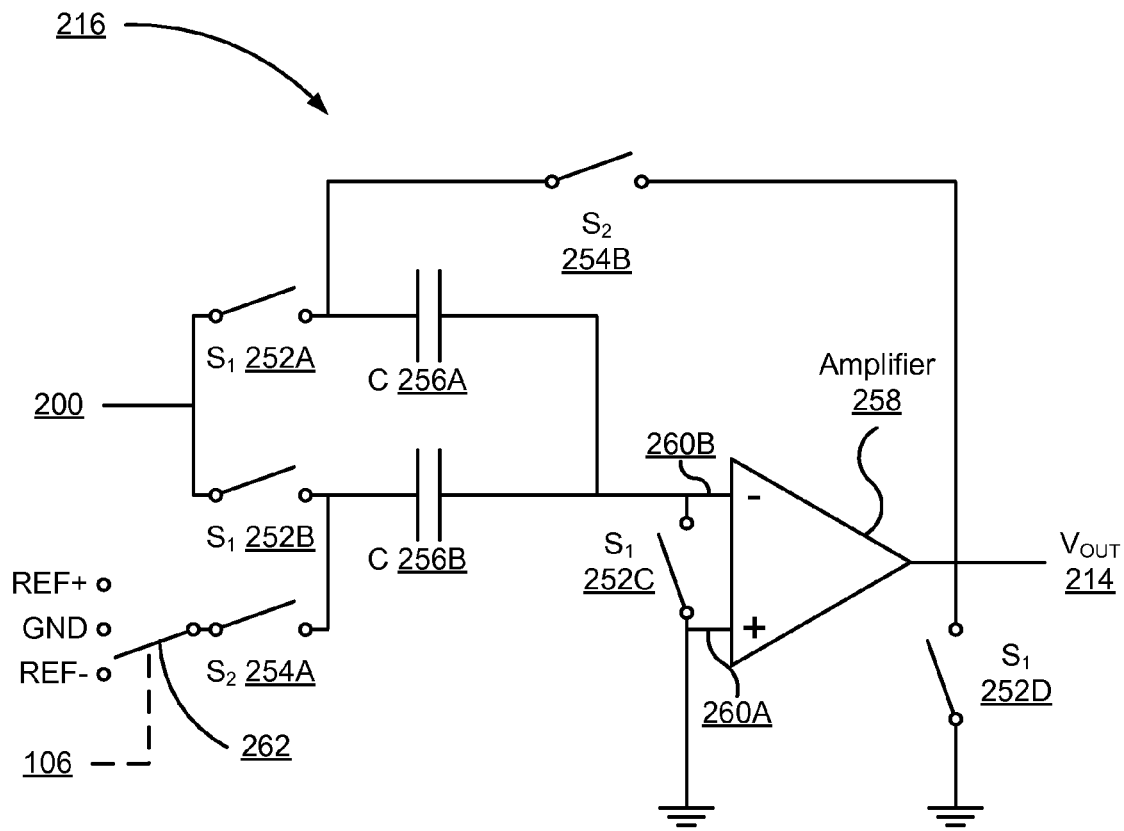
FIG. 2B is a circuit diagram illustrating an example multiplying digital-to-analog converter (MDAC) circuit.

FIG. 2B is a circuit diagram illustrating an example MDAC circuit 216 that implements the functions of the DAC 204, the subtractor 208, and the amplifier 212 of a 1.5-bit pipeline ADC stage 104. The MDAC circuit 216 contains a first set of switches 252A through 252D, a second set of switches 254A and 254B, capacitors 256A and 256B, an amplifier 258, and a third switch 262. During a reset phase 304 at the beginning of every cycle 302, the first set of switches 252A through 252D is turned on and the second set of switches 254A and 254B is turned off. As a result, the capacitors 256 function as a sample and hold circuit that samples the input voltage 200, and the switch 252D resets the output voltage 214 of the amplifier.

During a charge transfer phase 306 that follows the reset phase 304, switches 252A through 252D are turned off and switches 254A and 254B are turned on. Since the output 106 of the ADC 202 is connected to the third switch 262, closing the switch 254A injects a charge representing the quantized input 206 into the node 260B, which causes a corresponding voltage change at the node 260B. In other words, the third switch 262 and the capacitors 256A and 256B perform the functions of the DAC 204 and the subtractor 208. Meanwhile, the amplifier 258 and the feedback loop that forms when the switch 254B is turned on allows the output 214 to settle to a settling voltage with high precision, and the settled voltage is passed to the next stage as a residue.

Figure 3:
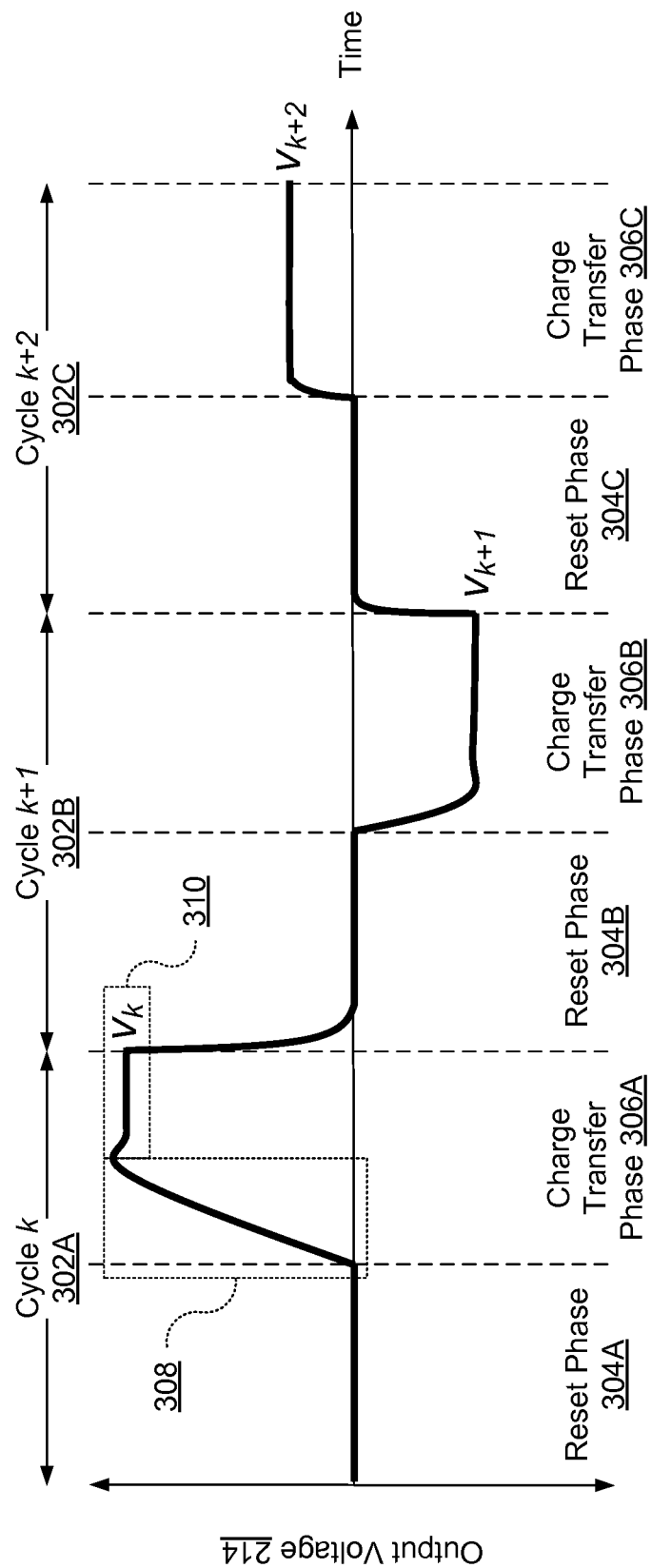
FIG. 3 is a timing diagram illustrating the output voltage of one stage of a pipeline ADC during three consecutive cycles.

FIG. 3 is a timing diagram illustrating the output voltage 108 of one stage 104 of a pipeline ADC 100 over three cycles 302A through 302C. As described above with reference to FIG. 2B, each of the cycles 302A through 302C includes a reset phase 304A though 304C followed by a charge transfer phase 306A through 304C. During the reset phase 304A through 304C, the output voltage 214 is zero because the switch 252D connects the output node to ground. During the charge transfer phase 306A through 306C, the output 214 changes to a settled voltage that represents the residual calculated by the stage 104.

There are two main drawbacks that reduce the efficiency of the MDAC circuit 214 described above with reference to FIG. 2B and FIG. 3. First, the amplifier 258 draws the same amount of power during the reset phase 304A through 304C and the charge transfer phase 306A through 306C. Since the amplifier 258 is not used during the reset phase 304A through 304C, the power consumed by the amplifier 258 during this time is wasted.

A second drawback is that the slope of the transient response at the beginning 308 of the charge transfer phase 306 is limited by a slew rate of the amplifier 258. The slew rate can be improved by increasing the drain current of the amplifier 258, but increasing the drain current also increases the power consumption of the amplifier 258. Furthermore, an increased drain current is much more beneficial at the beginning 308 of the charge transfer phase 306 when the slope of the transient response is steepest. In the region 310 where the output approaches the settling voltage, the transient response is no longer limited by the slew rate. Thus, maintaining an increased drain current during the entire charge transfer phase 306 results in a waste of power once the output voltage reaches the region 310 near the settled voltage.

Example Circuit with Power Switching Capabilities

Figure 4:
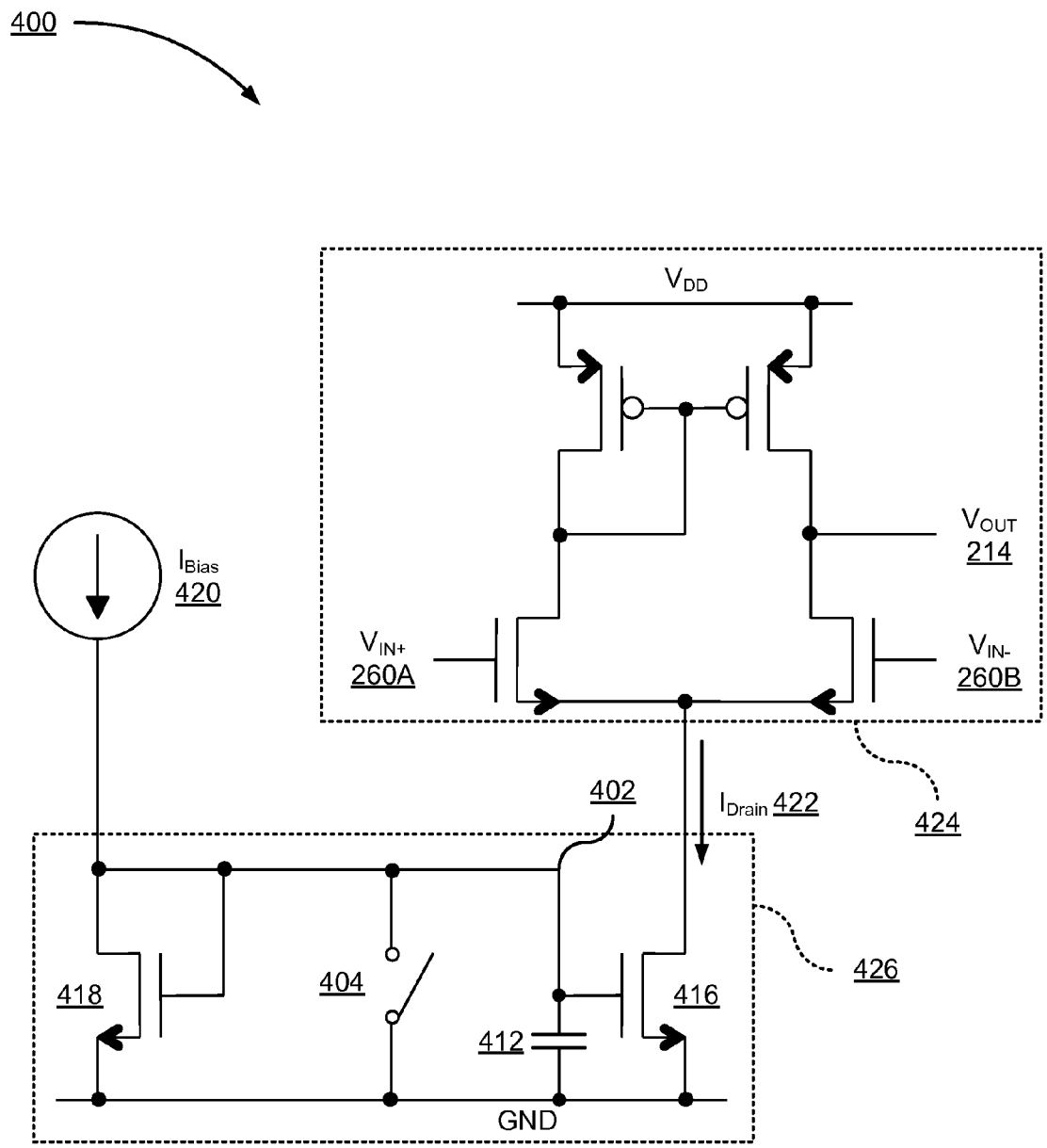
FIG. 4 is a circuit diagram illustrating an implementation of an amplifier and a current mirror configured to perform power switching for the amplifier.

FIG. 4 is a circuit diagram illustrating an implementation of an amplifier 424 and a current mirror 426. The amplifier 424 performs the functions of the amplifier 258 of the example MDAC circuit shown in FIG. 2B. The amplifier 424 is connected to the current mirror 426, which means the current mirror 426 may be used to regulate the current consumption of the amplifier 424. The current mirror 426 shown in the circuit 400 of FIG. 4 also contains a power switching function, which enables the current mirror 426 to power off the amplifier 424 during the reset phase 304 of each cycle 302.

The current mirror 426 contains a sink transistor 416, a biasing transistor 418, a switch 404, and a parasitic capacitor 412. When the switch 404 is turned off, the biasing transistor 418 maintains the node 402 at a constant bias voltage (e.g., 0.7 V) that is high enough to operate the sink transistor 416 within its saturation region. As a result, a drain current 422 flows from the amplifier 424, through the sink transistor 416, to ground, thus turning on the amplifier 424. When the switch 404 is turned on, the node 402 and the gate voltage of the sink transistor 416 are pulled to ground. As a result, the sink transistor 416 has zero drain current 422, which turns off the amplifier 424.

The amplifier 424 shown in FIG. 4 is a simplified amplifier that is included merely for the sake of illustration. The operation and function of the amplifier 424 is known in the art and description thereof is omitted for the sake of brevity. In other embodiments, a more sophisticated amplifier may be used. A more sophisticated amplifier may contain, among other things, additional amplifying stages and additional sink transistors. In an embodiment where the amplifier has multiple sink transistors, a separate instance of the entire current mirror 426 may be used to regulate each drain current. Alternatively, it is also possible to connect the gates of each additional sink transistor to the node 402. This allows a single biasing transistor 418 and switch 404 to regulate multiple drain currents at once.

The power switching method implemented by the circuit 400 of FIG. 4 comes with a few key disadvantages. When the switch 404 is turned off, the sink transistor 416 does not have a significant drain current 422 until biasing current source 420 is able to charge the parasitic capacitor 412. The parasitic capacitor 412 includes parasitic capacitances associated with the gates of the transistors 416, 418 and with the routing lines that connect the components of the current mirror 426. In most implementations, the gate capacitance of the sink transistor 416 is the largest contributor to the parasitic capacitor 412. At faster sampling rates, the delay associated with charging the parasitic capacitor 412 does not leave enough time during the charge transfer phase 306 for the output voltage to settle to a precise value. In addition, the circuit 400 of FIG. 4 does not address the slew rate limitation that constrains the settling time of the output voltage 214.

Increasing Slew Rate with Capacitive Driving

Figure 5A:
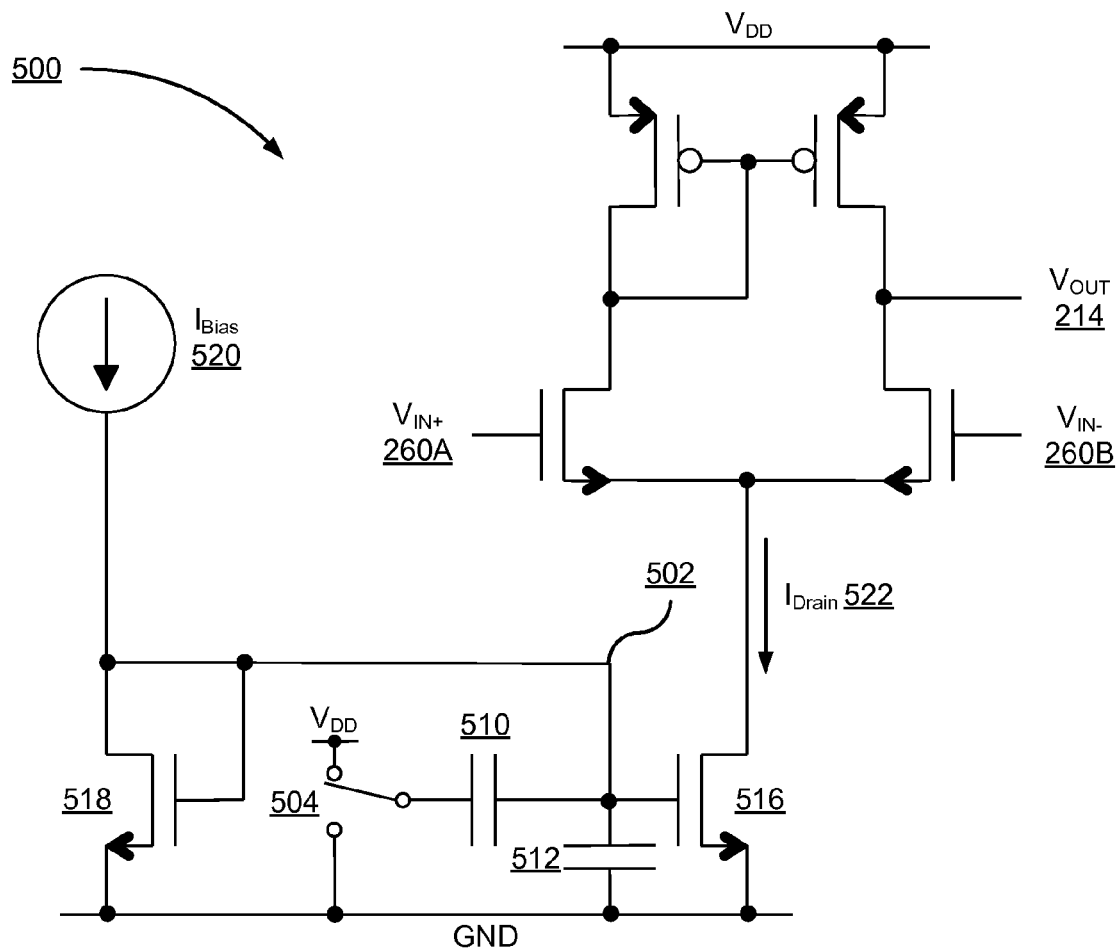
FIG. 5A is a circuit diagram illustrating an amplifier and a modified current mirror, in accordance with one embodiment.

FIG. 5A is a circuit diagram illustrating a modified current mirror that is configured to temporarily increase the gate voltage of a sink transistor 516 for the amplifier, in accordance with one embodiment. Similar to the circuit 400 in FIG. 4, the circuit 500 in FIG. 5A also contains an amplifier and a current mirror. The current mirror contains a sink transistor 516, a parasitic capacitor 512, and a biasing transistor 518 that perform the same functions as the corresponding components in the circuit 400 of FIG. 4. However, the current mirror of the circuit 500 additionally contains a driving capacitor 510. One plate of the driving capacitor 510 is coupled to the node 502, and the other plate is coupled to a switch 504 that connects the other plate to either a supply voltage $V_{DD}$ or ground. The switch 504 and the driving capacitor 510 operate in conjunction to generate a temporary increase in the gate voltage of the sink transistor 516 at the beginning of the charge transfer phase 306. This is beneficial, among other reasons, because it increases the slew rate of the amplifier output 214 without increasing the overall power consumption of the circuit 500.

Figure 5B:
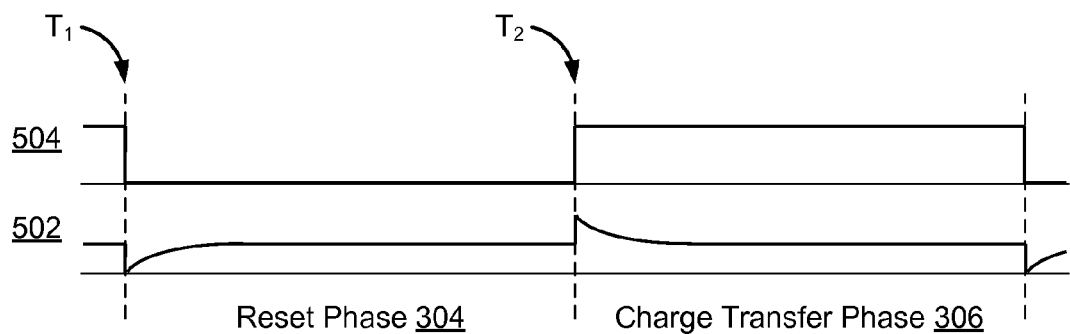
FIG. 5B is a timing diagram illustrating the operation of the switch and the corresponding gate voltage of the sink transistor of FIG. 5A, in accordance with one embodiment.
Figure 5C:
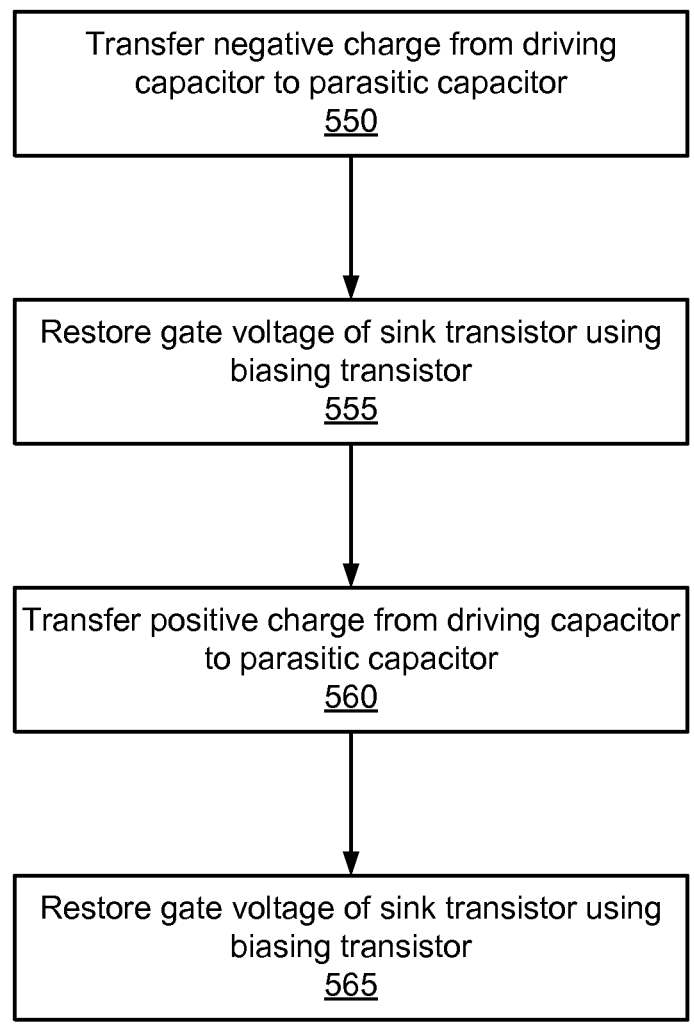
FIG. 5C is a flow chart illustrating a process for operating the circuit of FIG. 5A, in accordance with one embodiment.

FIG. 5B is a timing diagram illustrating the operation of the switch 504 and the corresponding gate voltage 502 of the sink transistor 516 over one cycle 302, and FIG. 5C is a flow chart illustrating a method of operating the embodiment of FIG. 5A. At the end of each cycle 302, the switch 504 is at the supply voltage $V_{DD}$. That is, the left plate of the driving capacitor 510 is positively charged and the right plate is negatively charged.

At the beginning of the reset phase 304 of a new cycle 302 (shown as $T_1$ in FIG. 5B), the switch 504 is switched from the supply voltage $V_{DD}$ to ground. This causes a negative charge to enter the left plate of the driving capacitor 510, which transfers 550 the negative charge on the right plate of the driving capacitor 510 to the top plate of the parasitic capacitor 512. As a result, the voltage at the node 502 drops, which temporarily decreases the drain current 522. However, the reduction in the drain current 522 does not affect the operation of the stage 104 because the amplifier is not used during the reset phase 304. The temporary drop in the voltage at the node 502 causes the biasing current source 520 to gradually start recharging the driving capacitor 510 and the parasitic capacitor 512. Since the node 502 is also connected to the biasing transistor 518, the voltage at the node 502 and, by extension, the gate of the sink transistor 516, is gradually restored 555 to the biasing point.

At the beginning the charge transfer phase 306 (shown as $T_2$ in FIG. 5B), the opposite occurs. The switch 504 is switched from ground back to the supply voltage $V_{DD}$. This causes a positive charge to enter the left plate of the driving capacitor 510, which transfers 560 a positive charge from the right plate of the driving capacitor 510 to the top plate of the parasitic capacitor 512. As a result, the voltage at the node 502 and the gate voltage of the sink transistor 516 both rise, which increases the drain current 522. Again, the bias current source 520 and the biasing transistor 518 gradually restores 565 the voltage at the gate of the sink transistor 516 by allowing the excess positive charge to flow to ground.

This configuration is beneficial, among other reasons, because the switch 504 and the driving capacitor 510 cause a temporary increase in the gate voltage of the sink transistor 516 at the beginning of the charge transfer phase 306 in each cycle 302. This causes a temporary increase in the drain current 522 of the amplifier. The increase in the drain current 522, in turn, increases the slew rate of the output voltage 214 when the transient response of the output 214 is subject to the most rapid change 308. As a result, the response time of the output 214 is improved. In addition, the configuration shown in FIGS. 5A-5C has roughly the same power consumption as a traditional amplifier because the gate voltage of the sink transistor 516 (and thus the drain current 522) is restored to its original level, and the drop in the sink transistor's gate voltage and the drain current 522 at the beginning of the reset phase 304 compensates for the excess power assumption associated with the increased drain current 522 at the beginning of the charge transfer phase 306.

Performing Power Switching with Capacitive Driving

Figure 6A:
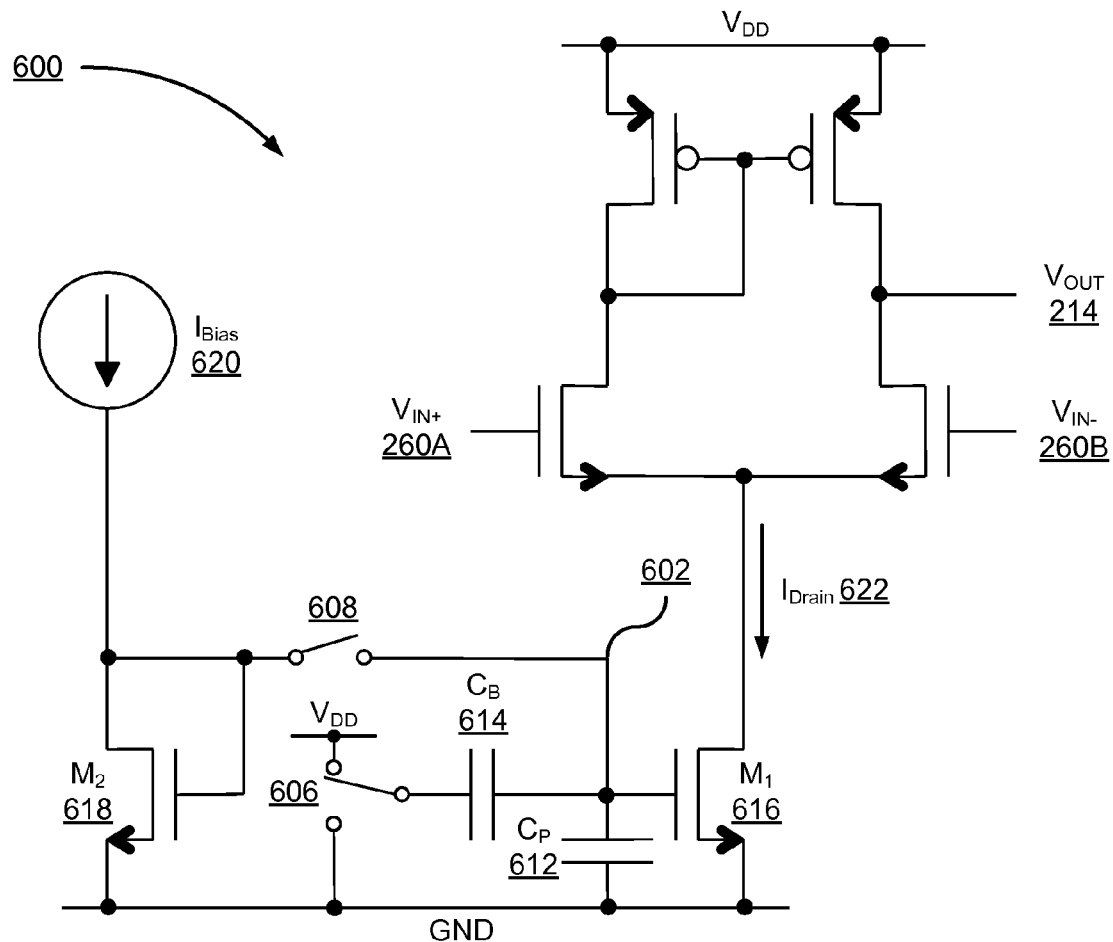
FIG. 6A is a circuit diagram illustrating an amplifier and a modified current mirror, in accordance with another embodiment.

FIG. 6A is a circuit diagram illustrating a modified current mirror that is configured to rapidly increase and decrease the gate voltage of a sink transistor for the amplifier, in accordance with another embodiment. Similar to the circuit 400 of FIG. 4 and the circuit 500 of FIG. 5A, the circuit 600 of FIG. 6A also contains a current mirror with a sink transistor 616, a biasing transistor 618, and a parasitic capacitor 612. These three components 616, 618, 612 perform the same functions as the corresponding components in the previous two circuits 400, 500. However, the current mirror of this circuit 600 also contains two switches 606, 608 and a driving capacitor 614. The first switch 606 connects the left plate of the driving capacitor 614 to either a supply voltage $V_{DD}$ or ground, and the second switch 608 connects the node 602 to the biasing transistor 618 and the biasing current source 620. The switches 606, 608 and the driving capacitor operate in conjunction to perform rapid power switching for the amplifier.

Figure 6B:
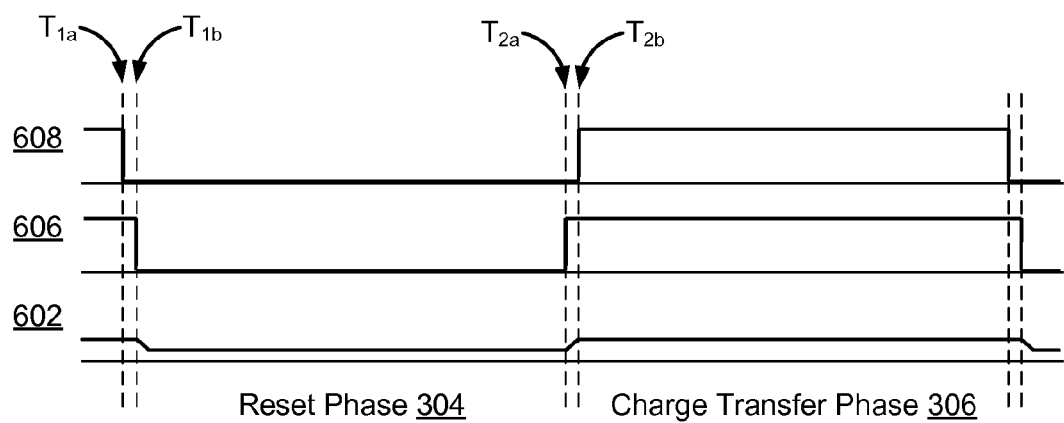
FIG. 6B is a timing diagram illustrating the operation of the switches and the corresponding gate voltage of the sink transistor of FIG. 6A, in accordance with one embodiment.
Figure 6C:
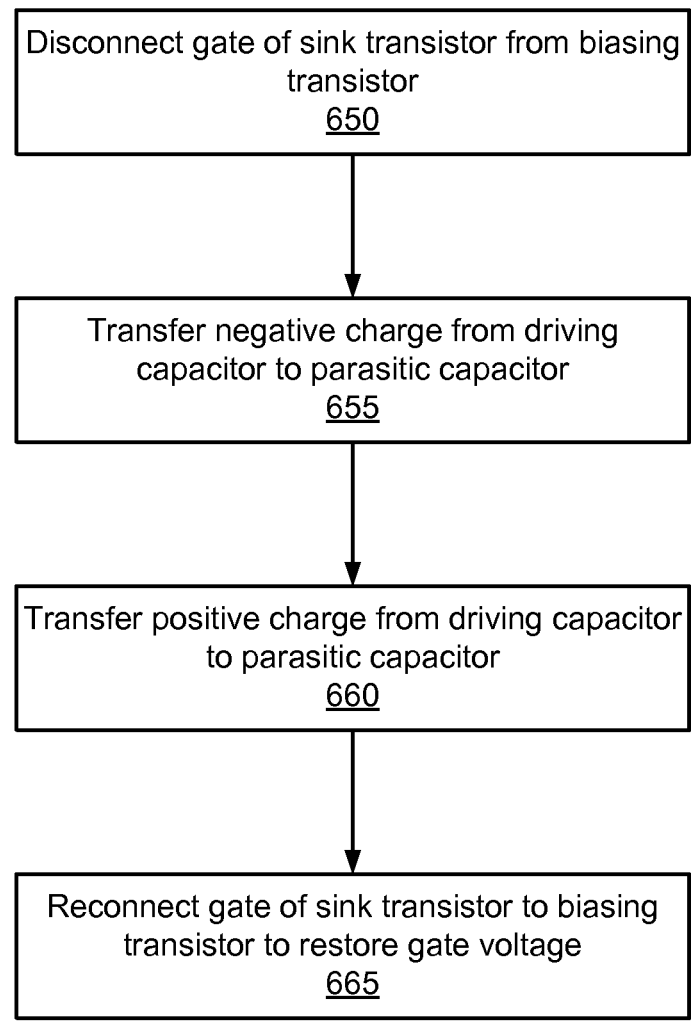
FIG. 6C is a flow chart illustrating a process for operating the circuit of FIG. 6A, in accordance with one embodiment.

FIG. 6B is a timing diagram illustrating the operation of the switches 606, 608 and the corresponding gate voltage of the sink transistor 616 over one cycle 302, and FIG. 6C is a flow chart illustrating a method of operating the embodiment of FIG. 6A. The conditions at the end of a cycle 302 for the circuit 600 of FIG. 6A are similar to the corresponding conditions for the previous circuit 500. Again, the node 602 and the gate of the sink transistor 616 are at the bias voltage, and the sink transistor 616 is forcing the drain current 622 to pass through the amplifier. Additionally, the first switch 606 is connected to the supply voltage $V_{DD}$ and the second switch 608 is turned on. Thus, the left plate of the driving capacitor 614 is positively charged and the right plate is negatively charged.

At the beginning of a new cycle 302 (shown as $T_{1a}$ in FIG. 6B), the second switch 608 is turned off, which disconnects 650 the gate of the sink transistor 616 from the biasing transistor 618. By disconnecting the gate of the sink transistor 616 from the biasing transistor 618, the node 602 is left floating. At $T_{1b}$ in FIG. 6B, a short time after the second switch 608 is turned off, the first switch 606 is switched from the supply voltage to ground. This transfers a negative charge into the left plate of the driving capacitor 614, which in turn transfers 655 a corresponding negative charge from the right plate into the top plate of the parasitic capacitor 612. The transfer of negative charge causes the voltage at the node 602 and the gate of the sink transistor 616 to drop, and since the node 602 is floating, the voltage remains at the lower level. The size of the driving capacitor 614 may be chosen so that the gate voltage of the sink transistor 616 drops to a low enough level to either significantly decrease the drain current 622 or completely prevent the drain current 622 from flowing to ground. This prevents the amplifier from drawing power during the reset phase 304.

At the beginning of the charge transfer phase 306 (shown as $T_{2a}$ in FIG. 6B), the first switch 606 is switched from ground back to the supply voltage $V_{DD}$. This transfers a positive charge into the left plate of the driving capacitor 614, which in turn transfers 660 a corresponding positive charge into the parasitic capacitor 612. The transfer of charge restores the gate voltage of the sink transistor 616 to a voltage that is very close to the bias voltage established by the biasing transistor 618. As a result, the sink transistor 616 is driven back into its saturation region and allows the drain current 622 to start flowing again, thus turning the amplifier on. At $T_{2b}$ in FIG. 6B, a short time after the start of the charge transfer phase 306, the second switch 608 is turned on, which reconnects 665 the node 602 and gate of the sink transistor 616 to the biasing transistor 618, thus refreshing the voltage at node 602.

The configuration described with reference to FIGS. 6A-6C is beneficial because it provides for a way to rapidly turn the amplifier on and off. Unlike the circuit 400 described with reference to FIG. 4, the circuit 600 of FIG. 6A is able to rapidly recharge the parasitic capacitor 612 and thus restart the amplifier at the beginning of the charge transfer because most of the charge is being transferred from the driving capacitor 614 rather than the biasing current source 620, which provides positive charge at an extremely limited rate. In the embodiment of FIG. 6A, the biasing current source 620 is merely used to replace the small amount of charge that is lost during the reset phase (e.g., due to a leakage current at the second switch 608). This means the amplifier can be turned off during the reset phase 304 to avoid unnecessarily dissipating power but can be restarted without significantly increasing the settling time of the amplifier output.

Increasing Slew Rate and Performing Power Switching with Capacitive Driving

Figures 7A, 7B:
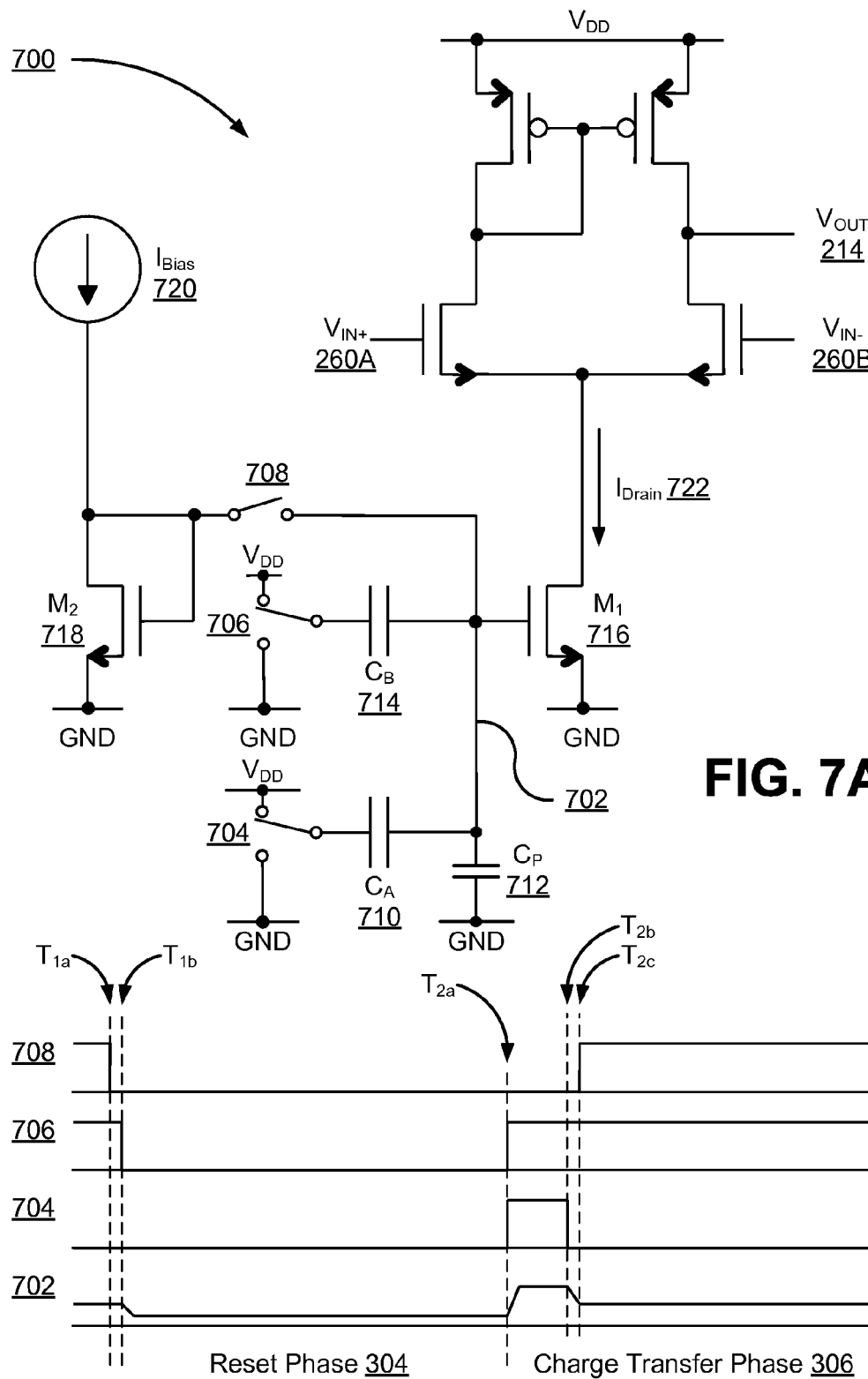
FIG. 7A is a circuit diagram illustrating an amplifier and a modified current mirror, in accordance with still another embodiment.
FIG. 7B is a timing diagram illustrating the operation of the switches and the corresponding gate voltage of the sink transistor in the circuit of FIG. 7A, in accordance with one embodiment.

FIG. 7A is a circuit diagram illustrating a modified current mirror that is configured to provide a temporary boost to the gate voltage of a sink transistor for the amplifier and rapidly increase or decrease the gate voltage, in accordance with one embodiment. Again, the circuit 700 of FIG. 7A contains a sink transistor 716, a biasing transistor 718, and a parasitic capacitor 712 that have the same functionality as the corresponding components in the previous circuits 400, 500, 600. Additionally, the circuit 700 contains a first driving capacitor 710 and a first switch 704 that perform the same functions as the driving capacitor 510 and switch 504 of the circuit 500 of FIG. 5A. The circuit 700 also contains a second driving capacitor 714 and two additional switches 706, 708 that perform the same functions as the driving capacitor 614 and the switches 606, 608 of the circuit 600 of FIG. 6A. In other words, the circuit 700 combines the functions and associated benefits of the previous two circuits 500, 600.

Figure 7C:
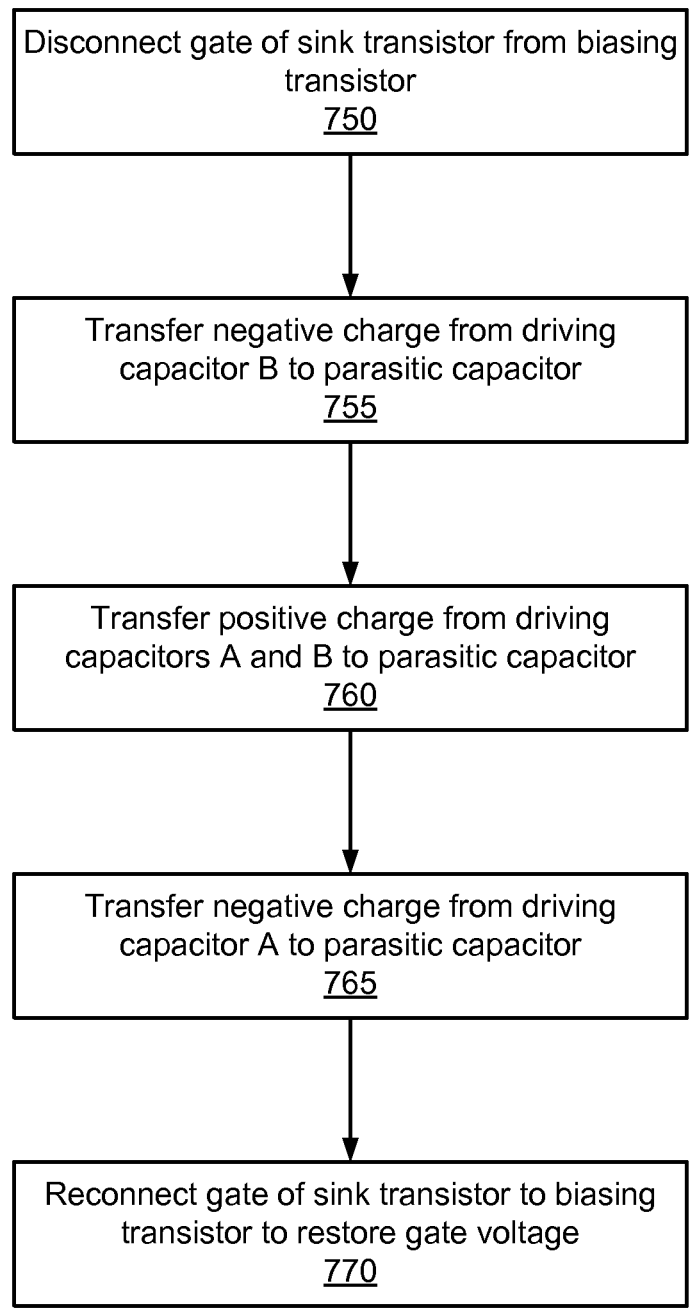
FIG. 7C is a flow chart illustrating a process for operating the circuit of FIG. 7A, according to one embodiment.

FIG. 7B is a timing diagram illustrating the operation of the switches 704, 706, 708 and the corresponding gate voltage of the sink transistor 716 over one cycle 302, and FIG. 7C is a flow chart illustrating a method of operating the embodiment of FIG. 7A. At the end of a cycle 302, the first switch 704 is connected to ground, the second switch 706 is connected to the supply voltage $V_{DD}$, and the third switch 708 is turned on. Similar to the previous circuits 400, 500, 600, the node 702 and the gate of the sink transistor 716 are at the bias voltage established by the biasing transistor 718. Thus, the left plate of the first driving capacitor 710 is negatively charged and the right plate is positively charged. Also, the left plate of the second driving capacitor 714 is a positively charged and the right plate is negatively charged.

At the beginning of a new cycle (shown in FIG. 7B as $T_{1a}$), the third switch 708 is turned off, which disconnects 750 the node 702 and the gate of the sink transistor 716 from the biasing transistor 718 and the biasing current source 720. The disconnection allows the node 702 and the gate of the sink transistor 716 to float. At $T_{1b}$ in FIG. 7B, a short time after the node 702 starts floating, the second switch 706 is switched from the supply voltage $V_{DD}$ to ground, which transfers a negative charge into the left plate of the second driving capacitor 714. The transfer of the negative charge causes a corresponding negative charge to be transferred 755 from the second driving capacitor 714 into the parasitic capacitor 712, which reduces the voltage at the node 702 and significantly reduces the drain current 722. The drain current 722 is either completely cut off (thus completely turning off the amplifier) or reduced to a level low enough to nearly turn off the amplifier. Since the node 702 is floating, the voltage at the node 702 remains low, and the amplifier remains nearly or completely turned off for the duration of the reset phase 304.

At the beginning of the charge transfer phase 306 (shown in FIG. 7B as $T_{2a}$), the first and second switches 704, 706 are both switched from ground to the supply voltage $V_{DD}$. As a result, the second driving capacitor 714 transfers 760 enough positive charge into the parasitic capacitor 712 to nearly restore the bias voltage at the node 702, and the first driving capacitor 710 transfers 760 an additional positive charge into the parasitic capacitor 712 that boosts the gate of the sink transistor 716 above the bias voltage. Similar to the embodiment described with reference to FIGS. 5A through 5C, this voltage boost increases the drain current 722 at the beginning of the charge transfer phase.

After a length of time passes (at $T_{2b}$ in FIG. 7B), the first switch 704 is switched from the supply voltage back to ground, which transfers 765 a negative charge from right plate of the first driving capacitor 710 into the parasitic capacitor 712. The transfer of negative charge pushes the node 702 and the gate of the sink transistor 716 back near the bias voltage value that is established by the biasing transistor

718. At T$_{2c}$, in FIG. 7B, a short time after T$_{2b}$, the third switch is turned on, which reconnects 770 the node 702 to the biasing transistor 718 and the biasing current source 720. The biasing transistor 718 and the biasing current source 720 operate in conjunction to replace any positive charge that may have been lost due to leakage currents and restore the node 702 to the bias voltage.

The embodiment of FIG. 7A takes the benefits of the embodiment of FIG. 5A and the embodiment of FIG. 6A. During the reset phase 304, the second driving capacitor 714 and the second and third switches 706, 708 either significantly reduce or completely cut off the drain current 722. Reducing the drain current 722 prevents the amplifier from drawing significant power when it is not in use, and completely cutting off the drain current 722 prevents the amplifier from drawing any power. At the beginning of the charge transfer phase 306, the second driving capacitor 714 and the switches 706, 708 rapidly turn on the amplifier without significantly increasing the settling time of the output 214. Meanwhile, the first driving capacitor 710 and the first switch 704 temporarily increase the drain current 722. The temporary increase in drain current 722 increases the slew rate of the output 214 while the transient response of the output 214 is subject to the most rapid change, thus improving the response time of the output 214. To avoid drawing an unnecessary amount of power, the first driving capacitor 710 and the first and third switches 704 708 restore the gate of the sink transistor 716 to the biasing voltage after the short boost period.

Additional Configuration Considerations

Although the disclosed embodiments were described in the context of a pipeline ADC, the principles behind the disclosed embodiments and the appended claims may be applied to any electronic device that operates switched capacitor circuits under distinct reset and charge transfer phases. For example, the principles behind the disclosed embodiments may be applied to a filter rather than an amplifier, or to other ADC architectures that contain at least one amplifier.

Upon reading this disclosure, those of skill in the art will appreciate still additional alternative structural and functional designs for a system and a process for using driving capacitors to dynamically regulate the drain current of an electronic device through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A current mirror circuit, comprising:
a first capacitor;
a first transistor having a gate coupled to a first plate of the first capacitor, the first transistor regulating current in an electronic component connected to the first transistor based on voltage at the gate;
a second transistor having a drain and a gate coupled to the gate of the first transistor to control the voltage at the gate of the first transistor;
a second capacitor coupled between the gate of the first transistor and a low reference voltage source; and
a first switch selectively coupling a second plate of the first capacitor to one of a high reference voltage source and the low reference voltage source,
wherein the first capacitor is configured to transfer a positive charge to the second capacitor responsive to coupling the second plate of the first capacitor to the high reference voltage source.

2. The current mirror circuit of claim 1, wherein the electronic component is an amplifier.

3. The current mirror circuit of claim 1, wherein the electronic component is coupled to a drain of the first transistor.

4. The current mirror circuit of claim 1, wherein second transistor is coupled between a current source and the low reference voltage source.

5. The current mirror circuit of claim 1, wherein the current mirror circuit is used in an analog-to-digital converter.

6. The current mirror circuit of claim 1, further comprising a second switch selectively coupling the drain and the gate of the second transistor to the gate of the first transistor.

7. The current mirror circuit of claim 6, further comprising a third capacitor having a first plate selectively coupled to the high reference voltage source and a second plate coupled to the gate of the first transistor.

8. A current mirror circuit, comprising:
a first capacitor;
a first transistor having a gate coupled to a first plate of the first capacitor, the first transistor regulating current in an electronic component connected to the first transistor based on voltage at the gate;
a first switch coupled to the gate of the first transistor;
a second transistor having a drain and a gate coupled via the first switch to the first transistor, the second transistor configured to control the voltage at the gate of the first transistor;
a second capacitor coupled between the gate of the first transistor and a low reference voltage source; and
a second switch selectively coupling a second plate of the first capacitor to one of a high reference voltage source and the low reference voltage source,
wherein the first capacitor is configured to transfer a positive charge to the second capacitor responsive to coupling the second plate of the first capacitor to the high reference voltage source.

9. The current mirror circuit of claim 8, wherein the electronic component is an amplifier.

10. The current mirror circuit of claim 8, wherein the electronic component is coupled to a drain of the first transistor.

11. The current mirror circuit of claim 8, wherein the second transistor is coupled between a current source and the low reference voltage source.

12. The current mirror circuit of claim 8, wherein the current mirror circuit is used in an analog-to-digital converter.

13. A method for operating a current mirror circuit, comprising:
receiving a biasing current at a drain of a first transistor;
controlling current in an electronic component by adjusting voltage at a gate of a second transistor;
coupling a first plate of a first capacitor to a low reference voltage source to transfer a negative charge from a second plate of the first capacitor to a second capacitor coupled to the second plate of the first capacitor and the gate of the second transistor;
coupling the first plate of the first capacitor to a high voltage source to transfer a positive charge from the second plate of the first capacitor to the second capacitor to increase the current in the electronic component; and
regulating operation of the electronic component based on a drain current of the second transistor.

14. The method of claim 13, wherein the electronic component is an amplifier.

15. The method of claim 13, wherein the electronic component is coupled to a drain of the second transistor.

16. The method of claim 13, wherein the first transistor is coupled between a current source and the low reference voltage source.

17. The method of claim 13, wherein the biasing current is received from a current source.

18. The method of claim 13, further comprising selectively coupling the drain and the gate of the first transistor to the gate of the second transistor.

* * * * *